US007065464B2

(12) United States Patent
Rieger et al.

(10) Patent No.: US 7,065,464 B2
(45) Date of Patent: Jun. 20, 2006

(54) MEASURING DEVICE WITH DIALOG CONTROL OCCURING VIA DIALOG WINDOWS AND CORRESPONDING METHOD

(75) Inventors: Angela Rieger, Munich (DE); Kurt Lainer, Kirchheim bei Muenchen (DE); Bernhard Reifert, Muehldorf (DE); Valentin Illich, Munich (DE); Sebastian Thoma, Rosenheim (DE)

(73) Assignee: Rohde & Schwarz GmbH & Co. KG, München (DE)

( * ) Notice: Subject to any disclaimer, the term of this patent is extended or adjusted under 35 U.S.C. 154(b) by 81 days.

(21) Appl. No.: 10/477,936

(22) PCT Filed: May 3, 2002

(86) PCT No.: PCT/EP02/04889

§ 371 (c)(1),
(2), (4) Date: May 26, 2004

(87) PCT Pub. No.: WO02/095565

PCT Pub. Date: Nov. 28, 2002

(65) Prior Publication Data
US 2004/0204886 A1    Oct. 14, 2004

(30) Foreign Application Priority Data
Aug. 10, 2000  (DE) .............................. 101 39 491
May 18, 2001  (DE) .............................. 101 24 371

(51) Int. Cl.
*G01C 19/00*     (2006.01)
*G01R 13/00*     (2006.01)

(52) U.S. Cl. ..................... 702/104; 702/66; 345/440.1
(58) Field of Classification Search ................ 702/104, 702/57, 66, 116; 345/440.1, 440, 157, 522
See application file for complete search history.

(56) References Cited

U.S. PATENT DOCUMENTS 5,321,420 A  *  6/1994  Rezek et al. ............. 345/440.1
5,953,009 A       9/1999  Alexander

FOREIGN PATENT DOCUMENTS

| DE | 36 18 256 A1 | 12/1987 |
|---|---|---|
| DE | 41 11 181 A1 | 10/1992 |
| DE | 197 04 416 A1 | 8/1998 |
| DE | 198 33 203 A1 | 2/1999 |
| DE | 695 07 653 T2 | 2/1999 |
| DE | 695 17 350 T2 | 10/2000 |
| DE | 199 42 315 A1 | 5/2001 |
| EP | 0 548 646 A1 | 6/1993 |
| EP | 1 008 932 A2 | 6/2000 |
| JP | 11 212 754 | 8/1999 |

* cited by examiner

*Primary Examiner*—Michael Nghiem
*Assistant Examiner*—Meagan Walling
(74) *Attorney, Agent, or Firm*—Ditthavong & Mori, P.C.

(57) ABSTRACT

A measuring device includes a representation device on which dialog windows can be represented, in addition to a method and software for managing said dialog windows. Several parameters can be adjusted for at least one part of the functional units and input through the dialog windows. Each newly opened dialog window is associated with a soft key and represented by an icon in a window management strip. The respectively associated dialog windows can be placed in the forefront using the soft keys.

16 Claims, 4 Drawing Sheets

MEASURING DEVICE WITH DIALOG CONTROL OCCURING VIA DIALOG WINDOWS AND CORRESPONDING METHOD

FIELD OF THE INVENTION

The invention relates to a measuring device with dialog operation via dialog windows for setting adjustment parameters of the functional units of the measuring device as well as a method for management of the dialog windows and a computer program for implementation of the procedural steps.

BACKGROUND OF THE INVENTION

During the operation of measuring devices, the functions are conventionally selected via operating keys. After a function has been selected, the value of an adjustment parameter, which is allocated to the corresponding function, can be altered by activating a rotary knob. If several possible adjustment parameters associated with the same function operate together as a parameter set, the individual adjustment parameters must be selected one after the other using a corresponding number of operating keys, so that the complete set a parameters has to be worked through. In the case of a measuring device with a comprehensive range of functions and an accordingly large number of individual functions and associated adjustment parameters, either a large number of operating keys is required or multiple definition of the individual operating keys is necessary.

A large number of operating keys and multiple definition of the operating keys combine with the increasing complexity of the functional structure to form a complicated system, which makes operation of the measuring device considerably more difficult in practice. In particular, it is not possible to gain a rapid overview, for example, of all the adjustment parameters associated with a specific function.

Regarding the technical background, reference must be made to U.S. Pat. No. 5,953,009. This document describes the allocation of trigger functions to a measuring channel of a digital oscilloscope by clicking and moving across the user interface icons which symbolise the trigger functions. However, the signal flow of individual functional units and the function of these functional units are not recognisable and cannot be selected on the user interface.

SUMMARY OF THE INVENTION

The present invention is directed to providing a measuring device with logically-arranged, dialog-managed operation, as well as a corresponding method and a computer program.

With the concept of dialog-managed operation of the measuring device according to an embodiment of the invention, the user is guaranteed a high level of transparency for any adjustments implemented because of the combined display of adjustment parameters in dialog windows. By defining soft keys, a dialog window can be displayed in each case in the foreground, so that a complete set of adjustment parameters for a given functional unit can be perceived as a glance. In this context, the current definition of soft keys is always indicated, for example, in a window management strip, so that the user can operate several dialog windows intuitively.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

One exemplary embodiment is explained in greater detail below with reference to the drawings. The drawings are as follows.

DETAILED DESCRIPTION OF THE PREFERRED EMBODIMENT

Figure 1:
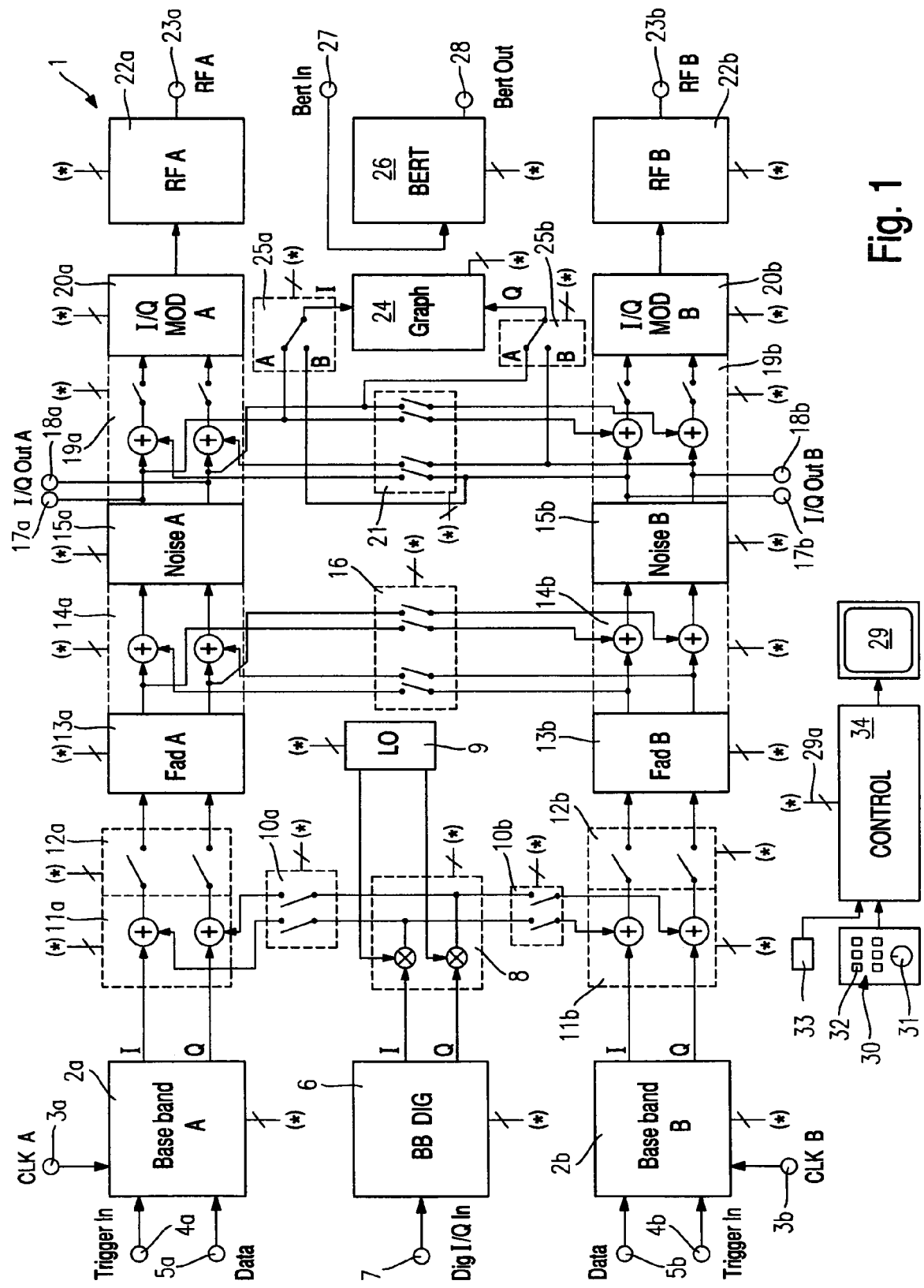
FIG. 1 shows a block circuit diagram of an exemplary embodiment of a signal generator designed as a measuring device according to the invention.

Before describing exemplary embodiments of the graphic display and the management of the dialog windows on the basis of FIGS. 3 and 4, a block circuit diagram of a signal generator, which is designed as a measuring device 1 according to the invention, will first be described with reference to FIG. 1, and an example of the functional blocks displayed on the display device will be explained with reference to FIG. 2. The measuring device need not necessarily be a signal generator; it may also be a protocol tester or a spectrum analyser.

The signal generator 1 comprises a first base band unit 2a and a second base band unit 2b. The base band units 2a and 2b generate base band signals at their I and Q outputs according to predefined standards which can be selected by the user, for example, according to the GSM standard, the GSM-EDGE standard or the Wideband-CDMA standard. The base band units 2a, 2b are supplied with clock signals at ports 3a, 3b, trigger signals at ports 4a and/or 4b and modulation data at ports 5a and/or 5b. In the exemplary embodiment illustrated, a digital base band generator unit 6 is provided alongside these units, which generates the I and Q components of a further base band signal from digital I/Q-values supplied to port 7. The output signal from the digital base band generator 6 can be multiplied in a multiplication unit 8, to which the constant frequency from an adjustable local oscillator 9 is supplied.

The optionally multiplied base band signal from the digital base band generating unit 6 can be supplied via a switching element 10a and/or a second switching element 10b, to the digital addition unit 11a or digital addition unit 11b.

The output signal from the base band units 2a and 2b and/or from the addition units 11a and 11b is supplied, via a switching element 12a and/or a switching element 12b, to a fading unit 13a and/or 13b, which applies fading (variable shrinkage) to the base and signal. The functions of the fading units 13a and 13b, such as the number, the time delay and the attenuation of the signal delay paths implemented in the fading unit can be specified by the user. The fading units 13a and 13b are connected via an addition unit 14a and/or 14b in each case to a noise unit 15a and/or 15b. The noise units 15a, 15b apply a noise signal, which can be specified by the user, to the base band signal, wherein, for example, the type and level of the noise signal generated by the noise unit 15a, 15b can be selected by the user.

Instead of providing a separate connection of the relevant fading units 13a and/or 13b to the allocated noise unit 15a and/or 15b, the output signals from the fading units 13a, 13b can be added by means of a switching element 16 which connects the addition units 14a and 14b, and supplied in each case, to one of the two noise units 15a and/or 15b . . . . The I/Q-output signals at the output of the noise units 15a and/or 15b can be tapped at ports 17a and 18a or 17b and 18b.

The output signals from the noise units 17a and 17b can be supplied to I/Q-modulators 20a and/or 20b via addition units and switching units 19a and 19b. In this context, the output signals from the noise units 15a and 15b can be added via a switching element 21 and supplied to one of the two I/Q-modulators 20a and/or 20b. With reference to the function of the I/Q-modulators 20a and/or 20b, several user-specific selection options are also available. For example, the I/Q-modulator 20a, 20b can be operated in such a manner that it generates a burst-sequence, wherein the active bursts and/or the level of the active bursts can be selected by the user.

The I/Q-modulators 20a and 20b are each connected to a high-frequency unit 22a and/or 22b, and a high-frequency signal can be picked up at port 23a and/or 23b. For example, the output frequency or several output frequencies initiated according to the sudden frequency change procedure of the high frequency unit 22a and 22b can be selected by the user.

Additionally, a signal display 24 is provided, which, in the exemplary embodiment, can be connected via switching elements 25a and/or 25b to the output of the noise unit 15a or the noise unit 15b. Alternatively, it is also conceivable for the display device 24 to be connected directly to the outputs of the base band units 2a and 2b. For example, the signal display 24 allows a display of the constellation diagram, so that the user can monitor the method of operation of the connected signal paths.

Furthermore, a Bit Error Rate Tester (BERT) 26 is provided in such a manner that a signal from the device under test (DUT) can be supplied to the output port 27 of the Bit Error Rate Tester allowing the bit error rate of the signal to be picked up at the output port 28.

Further functional units and variant combinations of the functional units may also be provided. These have not been explained in greater detail for the sake of simplicity.

All of the functional units described above: 2a, 2b, 6, 8, 9, 10a, 10b, 11a, 11b, 12a, 12b, 13a, 13b, 14a, 14b, 15a, 15b, 16, 19a, 19b, 20a, 20b, 21, 22a, 22b, 24 and 26 are connected via a control bus to a control device 28 such as a CPU. The connection of the control bus to the functional units is indicated with the symbol (*). The control unit 34 controls the configuration and function of the individual functional units as required by the user. The current configuration of the functional units is displayed on the display device 29, which, together with the operating elements 30 may be disposed on the front of the signal generator 1. For this purpose, a graphic functional block is allocated to each functional unit, and the interconnection of the functional units is displayed on the display device 29 by corresponding connecting elements, which interconnect the functional blocks. The connections between the functional blocks and the functions of the functional blocks are selected either with a rotary knob 31 and/or corresponding operating buttons 32 or via a mobile positioning element 33 (mouse).

Several examples of the display of the functional blocks allocated to each of the functional units and the associated selection of functions for the relevant functional units will be explained below with reference to FIGS. 2 to 4.

Figure 2:
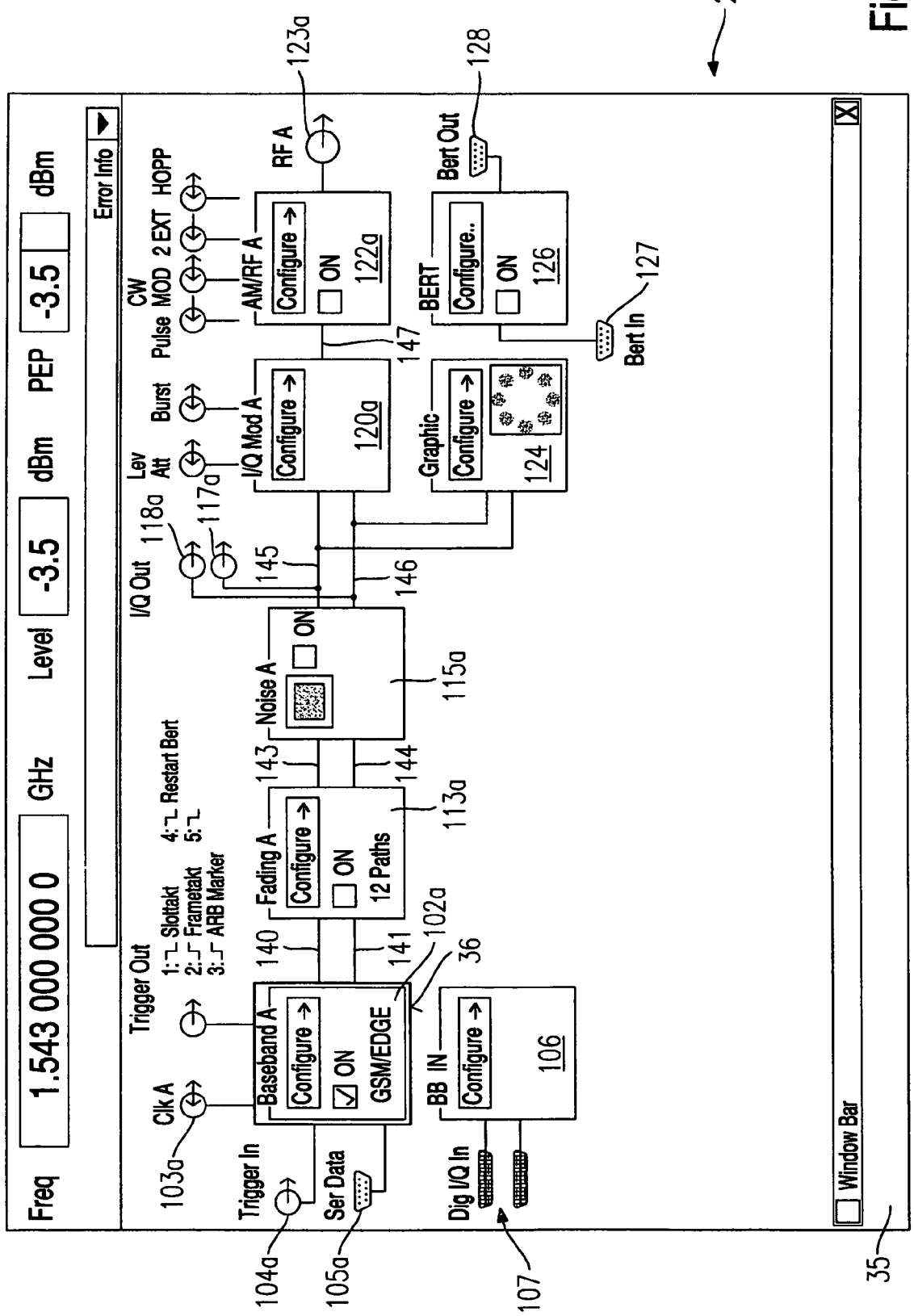
FIG. 2 shows an example of a view of the display device with functional units of the measuring device displayed as functional blocks.

FIG. 2 shows the display surface of the display device 29 in an initial functional example. It can be seen that the functional blocks presented on the display 29 correspond to the functional units described with reference to FIG. 1. The reference numbers for the functional blocks are greater, in each case by the value 100, than the reference numbers for the functional units presented in FIG. 1. In FIG. 2, a first base band block 102a corresponding to the first base band unit 2a, a first fading block 113a corresponding to the first fading unit 13a and a first noise block 115a corresponding to the first noise unit 15a, a first I/Q-modulator block 120a corresponding to the first I/Q-modulator 20a, a first high-frequency block 122a corresponding to the first high-frequency block 22a, display field 124 corresponding to the signal display 24 and a bit error rates test block 126 corresponding to the bit error rate tester 26, are displayed as functional blocks. In this context, the signal inputs and outputs and the data inputs and outputs 103a, 104a, 105a, 107, 117a, 118a, 123a, 127 and 128 correspond to the ports 3a, 4a, 5a, 7, 17a, 18a, 23a, 27 and 28 as shown in FIG. 1.

By observing the display device 29, the user can recognise at a glance, on the basis of the functional blocks displayed, which functional units have been selected and connected for the current functions of the signal generator 1. Furthermore, the user can immediately recognise which inputs and outputs are provided with signals and in which manner. The internal signal flow and therefore also the signal conditioning are presented to the user in a very transparent manner. For example, the user can immediately see that the fading unit 13a is arranged in front of the noise unit 15a, whether the bursting of the signal is implemented in the base band or in the high-frequency band, and to which ports external signals can be applied and how these will influence the signal flow. In particular, the user can immediately identify whether a port is acting as an input or an output. Current configurations can be identified in the functional blocks, particularly important parameters being displayed directly in the functional blocks. Moreover, the user can clearly see at which position the signal display 24 is connected into the signal path.

Figure 3:
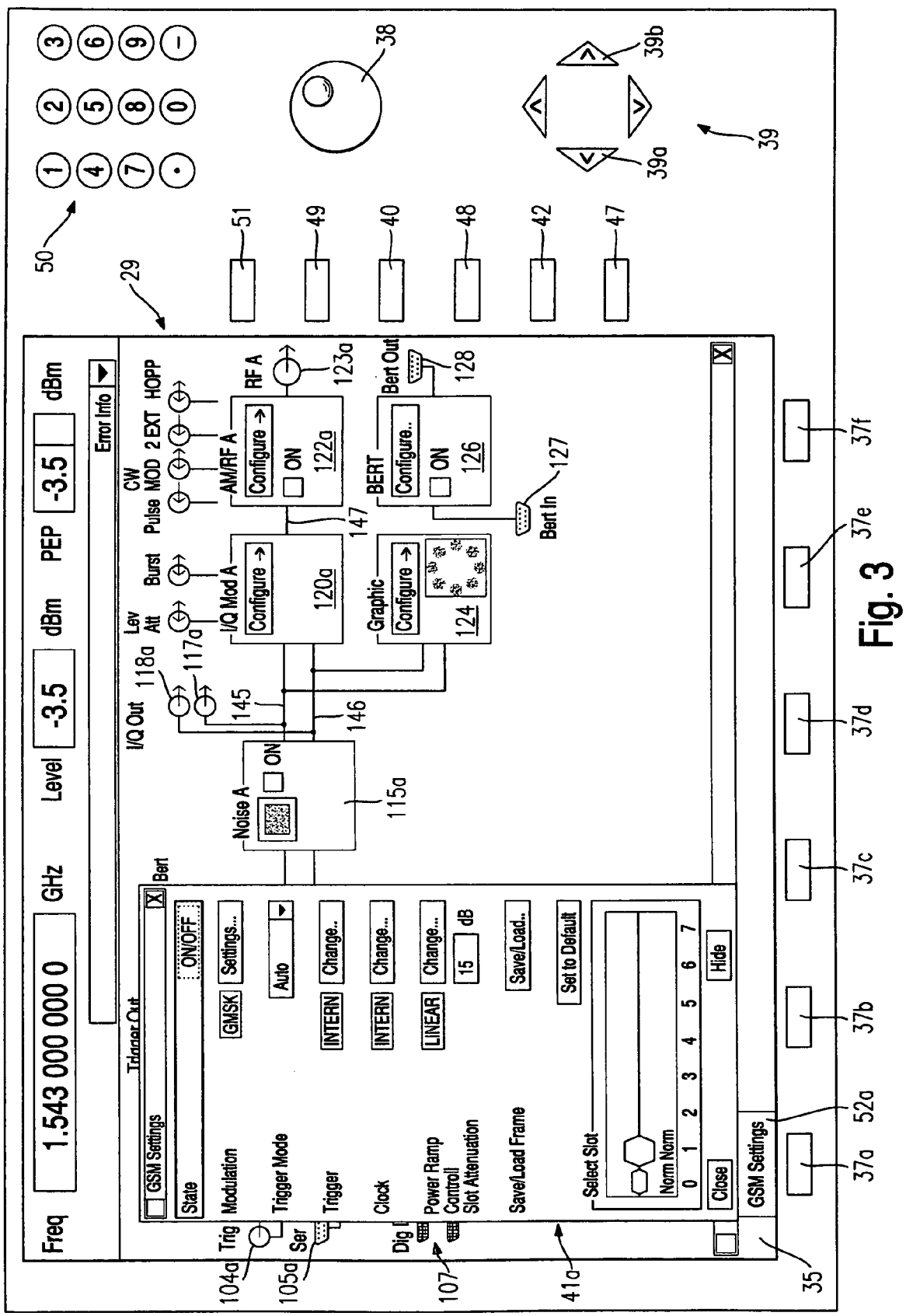
FIG. 3 shows a first example of a view of the front panel of a signal generator with one dialog window open.

If the functional block 102a, marked with a black marking frame (marking) 36 in FIG. 2 is selected, for example after previously selecting the "GSM/EDGE" standard via a function selection list, a dialog window 41a will be displayed in the foreground of the display device as shown in FIG. 3. A distinction must be made here between an open dialog and a dialog window, because a dialog can be open even if the corresponding dialog window in the display device is not displayed at that moment. Accordingly, in addition to opening the dialog window 41a, the open dialog is also entered in the window management strip 35. The entry in the window management strip 35, which is displayed visually by means of an icon 52a representing the open dialog, allocates the open dialog to an operating key in the form of a soft key, so that the dialog can be called up via the soft key 37a defined in the above manner, and the dialog window 41a of the dialog called-up is again displayed in the foreground of the display device 29. To allow intuitive operation, the icon 52a of the entry is allocated to the position of the soft key 37a.

The marking frame and/or the marking 36 with which a functional block can be marked, can be moved in a vertical direction by rotating a positioning element designed as a rotary knob 38. When several functional blocks are arranged adjacent to one another in a horizontal direction, the functionality of the rotary knob 38 can be expanded by means of direction keys 39, so that the marking frame 36 is moved from one functional block to a functional block horizontally adjacent by means of the left and right direction keys 39a and 39b. After moving the marking frame 36 to the functional block 102a, of which the adjustment parameters are to be changed, the functional block 102a can be selected by activating a selection device. The selection device can be designed, for example, as an input key 40 or as a push button in the rotary knob 38. If the measuring device 1 is used as a table top device rather than being integrated into a recording device, it is also possible to operate the device via a movable positioning element 33 (mouse).

To return to the display of the functional blocks, when the dialog window 41a is displayed in the foreground of the display device 29, the dialog window 41a can be returned to the background of the display device 29 using a given operating key ("background"). The actual dialog remains open, so that the entry in the window management strip 35 is retained. The dialog window 41a can be moved back into the foreground by means of the soft key 37a. In the now fully-visible display of the functional blocks, as shown in FIG. 2, a new functional block can be marked and selected in accordance with the above description.

Figure 4:
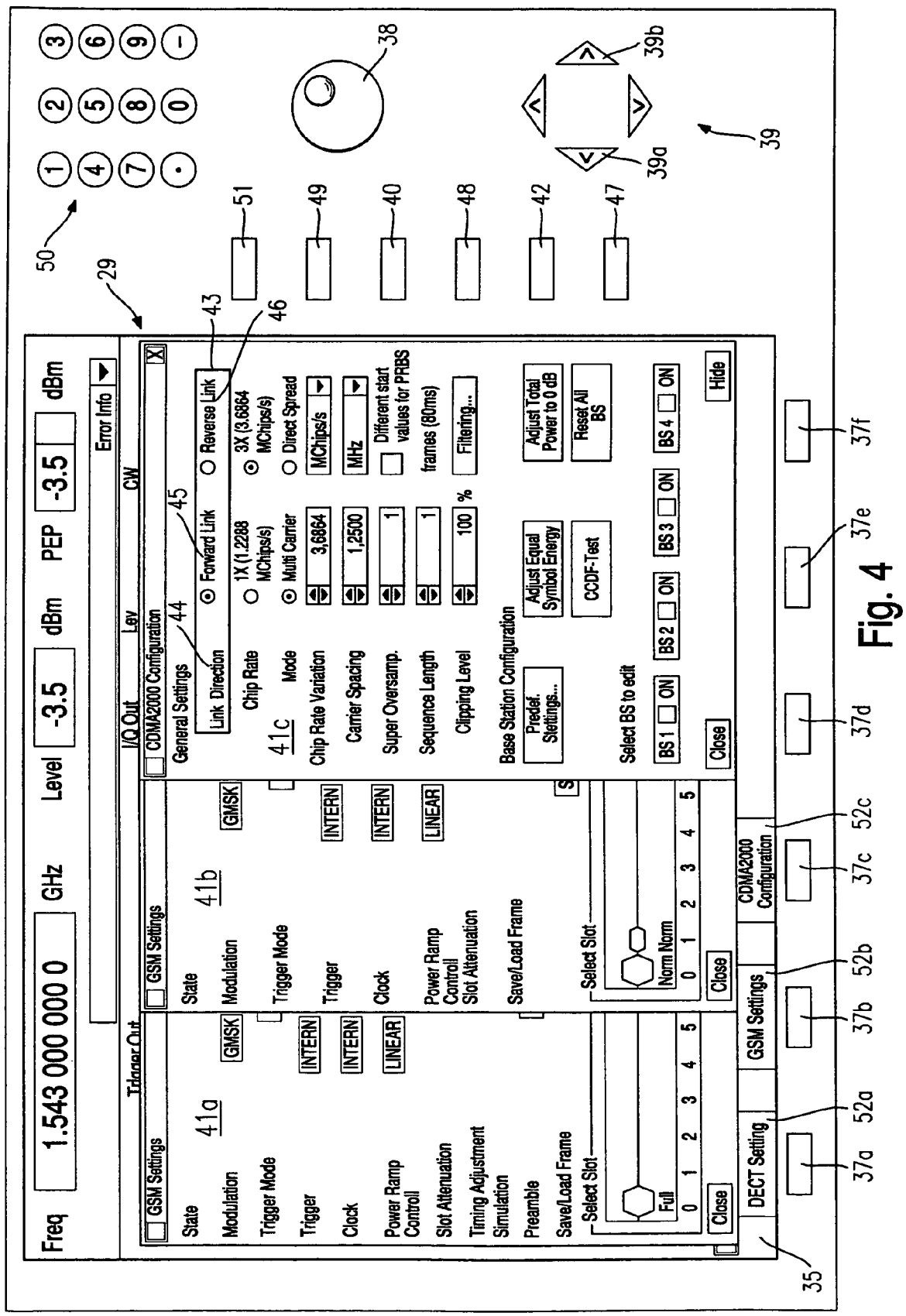
FIG. 4 shows a second example of a view of the front panel of a signal generator with several dialog windows open.

FIG. 4 shows an exemplary display of a front panel of the measuring device 1 with several dialog windows 41a to 41c displayed simultaneously on a display device 29. Further dialog windows 41b and 41c can be opened in a similar manner to the first dialog window 41a, a not-yet-defined soft key 37b and 37c being allocated in each case. The allocation of the new dialog windows 41b and 41c is stored in the window management strip 35 as a new entry, and corresponding new icons 52b and 52c are displayed visually.

Because of the limited area of the display device 29, the dialog windows 41a to 41c are displayed in an overlapping manner when they are opened. The position at which each new dialog window opens is predetermined, the number of already open dialog windows 41a to 41c being taken into account in determining the position, so that every dialog window 41a, 41b, which has not been moved in its entirety to the background by means of the "background" operating key 42, is only partially visible. In the display, this is shown with dialog windows 41a and 41b, whereas the active dialog window 41c is displayed in the foreground in a completely visible manner.

The adjustment parameters for those parameters which are disposed in the active dialog window can be changed. In FIG. 4, the dialog window 41c is active and therefore completely visible in the foreground. Another dialog window 41a or 41b can be shown as the active dialog window by pressing the appropriate soft key 37a or 37b. The new active dialog window 41a or 41b will then be displayed in its entirety in the foreground of the display device 29, and the now no-longer-active dialog window 41c will be partially obscured.

An adjustment parameter to be changed within the active dialog window 41c is selected via an operating focus function 43, which is indicated in the display as a frame around the operating elements 44, 45 and 46 associated with an operating block. In the example shown, the operating elements 44, 45 and 46 include the name of the adjustment parameter as operating element 44, and the two adjustment options allocated to the adjustment parameter as operating elements 45 and 46. The operating focus function 43 can be navigated and/or moved within the active dialog window by means of the rotary knob 38 and the direction keys 39.

In the case of the measuring device 1 shown in FIG. 4, the maximum possible number of 6 dialogs open at the same time is predetermined by the number of soft keys 37a to 37f. Opening a further dialog, in this case, means that a dialog must be closed, that is to say, a dialog window must be closed, and the allocated entry must be deleted from the window management strip 35. In this context, two different methods are available to user.

By pressing a soft key 37a to 37f, the user can move the dialog window associated with the dialog to be closed to the foreground. The active dialog window can then be closed via an operating key ("close") 47, which is realised as a hard key. At the same time as closing the dialog window 41b, for example, the entry allocated to the soft key 37b in the window management strip 35 is deleted. When a new dialog window is opened, the soft key 37b will be free and can therefore be defined with the entry for the new dialog to be opened.

By contrast, if all of the soft keys 37a to 37f have already been defined when the user opens a new dialog, then a dialog, of which the associated dialog window is closed at that time, will be automatically selected and the associated entry will be deleted from the window management strip 35. Selection of the dialog to be closed is preferably based on a comparison of the time during which the open dialog window has no longer been active. For example, the dialog window which has not been displayed in the foreground for the longest time will be selected and the dialog will be automatically closed.

As a result of the changing number of dialog windows to be displayed, it may become necessary to reorganise the distribution of dialog windows. For this purpose, a further operating key ("arrange") 48 is provided, with which the dialog windows 41a to 41c displayed in the foreground of the display device 29 at the time of pressing the key are distributed uniformly over the entire width the display device 29. An optimised display of this kind is shown in FIG. 4.

The operating keys realised as hard keys, "background" 42, "close" 47 and "arrange" 48, always act on the active dialog windows 41a to 41c. If all three open dialogs in FIG. 4 are to be closed, the operating key "close" 47 must be activated three times.

Moreover, with some of the dialogs, it may be meaningful to re-define the soft keys 37a to 37f in order to expand the entry options for the adjustment parameters. The current definition of the soft keys 37a to 37f is displayed in the window management strip 35 by means of appropriate icons. A further hard key, operating key 49 ("window management"), is provided in order to return to the original allocation of soft keys 37a to 37f with the dialogs open.

In addition to the operating keys on the front panel of measuring device 1 as listed above, which relate to the management of the dialogs and the windows, a keypad 50 is provided for entering alphanumeric values for the adjustment parameters and a "cancel" operating key 51 is provided to allow incorrect entries of values to be cancelled.

While the present invention has been described in connection with a number of embodiments and implementations, the present invention is not so limited but covers various obvious modifications and equivalent arrangements, which fall within the purview of the appended claims.

The invention claimed is:

1. A measuring device comprising:
   a plurality of functional units, wherein several adjustment parameters are provided for at least some of the functional units, and wherein changes to the adjustment parameters are entered via dialog windows,
   a control device configured to control setting of the adjustment parameters, and
   a visual display device capable of displaying the dialog windows,
   wherein each newly opened dialog window is allocated to a soft key and a current definition of the soft keys is displayed on the display device by means of icons, by means of which a relevant dialog window can be moved to a foreground of the display device, and wherein operating elements for functions, corresponding to the adjustment parameters for one of the functional units, are presented together in the dialog window,
   in the event of a complete allocation of all said soft keys to the dialog windows, if a further dialog window is opened, a least active dialog window is closed, and a soft key associated with the closed dialog window is allocated to the new dialog window.

2. A measuring device according to claim 1, wherein the adjustment parameters for a functional unit are changed instantaneously by the control device.

3. A measuring device according to claim 1, wherein a new dialog window opens at a position on the display device which can be specified by a preliminary setting.

4. A measuring device according to claim 1, wherein the current dialog window can be moved to the background by means of an operating key.

5. A measuring device according to claim 1, wherein the current dialog window can be closed again by another operating key.

6. A measuring device according to claim 1, wherein a plurality of operating elements form an operating block, which can be visually highlighted by means of an operating focus function.

7. A measuring device according to claim 6, wherein in an operating focus function of a plurality of operating blocks can be moved by means of a positioning element and/or by means of direction keys.

8. A measuring device according to claim 6, wherein a current operating block, highlighted by the operating focus function, can be selected using the selection means.

9. A method for managing dialog windows by means of which adjustment parameters for functional units of a measuring device can be entered, wherein the functional units are displayed on a display device as functional blocks, comprising:
   positioning a marker on the functional block by means of a positioning element;
   selecting the marked functional block using a selection means;
   displaying operating blocks, which correspond to the adjustment parameters of the selected functional unit, in an allocated dialog window;
   allocating every open dialog window to a soft key;
   displaying an icon representing an open dialog window in each case at a position on the display device corresponding to the allocated soft key; and
   closing, if a further dialog window is opened when all available soft keys have been allocated, a dialog window that has not been displayed in the foreground for the longest period.

10. A method according to claim 9, further comprising displaying, when a soft key is activated, the allocated dialog window in a foreground of the display device.

11. A method according to claim 9, further comprising moving an active dialog window displayed in the foreground of the display device to a background when an operating key is activated.

12. A method according to claim 9, further comprising closing an active dialog window displayed in the foreground of the display device when an operating key is activated.

13. A method according to claim 9, further comprising highlighting by an operation focus function, when a positioning element and/or direction keys are activated, an operating block adjacent to an operating block currently highlighted by the operating focus function.

14. A method according to claim 13, further comprising selecting the operating block currently highlighted by the operating focus function by activating a selection means.

15. A computer-readable medium bearing instructions for performing the method according to claim 9, when the instructions are executed on a computer or a control unit of a measuring device.

16. A machine-readable medium, bearing instructions for implementing the method according to claim 14 when the instructions are executed on a computer or a control unit of a measuring device.

* * * * *